United States Patent
Sasaki et al.

(10) Patent No.: US 6,784,413 B2
(45) Date of Patent: Aug. 31, 2004

(54) READING APPARATUS FOR READING FINGERPRINT

(75) Inventors: Kazuhiro Sasaki, Sagamihara (JP); Makoto Sasaki, Hachioji (JP); Hisashi Aoki, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 219 days.

(21) Appl. No.: 10/011,915

(22) Filed: Nov. 6, 2001

(65) Prior Publication Data

US 2002/0054394 A1 May 9, 2002

Related U.S. Application Data

(63) Continuation-in-part of application No. 09/263,167, filed on Mar. 5, 1999, now Pat. No. 6,414,297.

(30) Foreign Application Priority Data

Mar. 12, 1998 (JP) ............................................ 10-078575

(51) Int. Cl.⁷ ............................ H01L 31/02; H01B 5/14; G06T 7/00
(52) U.S. Cl. ....................... 250/214 R; 356/71; 382/124
(58) Field of Search ....................... 250/214 R; 356/71; 382/124, 126; 358/514

(56) References Cited

U.S. PATENT DOCUMENTS 4,255,686 A   3/1981  Maruyama et al.
4,887,166 A   12/1989 Kakinuma et al.
5,086,218 A   2/1992  Yagyu
5,635,723 A   6/1997  Fujieda et al.

FOREIGN PATENT DOCUMENTS

| EP | 0 447 754 A2 | 9/1991 |
| EP | 0 789 334 A2 | 8/1997 |
| EP | 0 901 093 A2 | 3/1999 |
| JP | 11-53524 A | 2/1999 |
| WO | WO 97/14111 A1 | 4/1997 |

OTHER PUBLICATIONS

Database WIP, Week 1919, Derwent Publications, Ltd., London, England, AN 99–219835; XP002104617, "Finger Print Reader" & JP 11–053524A (Casio Computer), Feb. 26, 1999; see Abstract.

Copy of Korean Official Action dated Nov. 5, 2001, issued in counterpart Korean Application No. 10–1999–7010383, entitled "Reading Apparatus", and English language translation thereof.

Primary Examiner—F. L. Evans
(74) Attorney, Agent, or Firm—Frishauf, Holtz, Goodman & Chick, P.C.

(57) ABSTRACT

A reading apparatus for reading a target object includes a photosensor module having a plurality of photosensors arranged at least one plane, and a transparent conductive layer provided between the target object and the photosensor module.

25 Claims, 16 Drawing Sheets

NONSELECTION

SELECTION

READING APPARATUS FOR READING FINGERPRINT

CROSS-REFERENCE TO RELATED APPLICATIONS

This is a Continuation-in-Part application of U.S. patent application Ser. No. 09/263,167, filed Mar. 5, 1999, now U.S. Pat. No. 6,414,297, the entire contents of which are incorporated herein by reference.

This application is based upon and claims the benefit of priority from the prior Japanese Patent Application No. 10-078575, filed Mar. 12, 1998, the entire contents of which are incorporated herein by reference.

BACKGROUND OF THE INVENTION

1. Field of the Invention

The present invention relates to a reading apparatus for reading a target object having a fine recessed or projecting pattern such as a fingerprint.

2. Description of the Related Art

A conventional reading apparatus for reading a target object having a fine recessed or projecting pattern such as a fingertip has a structure like the one disclosed in U.S. Pat. No. 5,635,723 in which a two-dimensional photosensor is formed on a surface light source, and an optical component is formed on the two-dimensional photosensor. The invention of this reference detects changes in capacitance when a finger touches the optical component, and sequentially detects the detection results as electric charges, which are generated by photosensors arranged two-dimensionally and correspond to an incident light quantity from the optical component. In this structure, many light guide fibers are mounted on the two-dimensional photosensor without any optical lens, so that the whole apparatus can be downsized. Recently, another type of structure is examined in which an optical component formed from many light guide fibers is made thinner into a light scattering film or in which the upper surface of a photosensor is covered with a transparent resin layer having an uneven surface without any optical component. For example, this type of structure is disclosed in U.S. patent application Ser. No. 09/128,237 (Aug. 3, 1998) filed by the present applicant.

In this reading apparatus, a finger directly touches the upper surface of the two-dimensional photosensor. If the finger is charged with static electricity, this static electricity may cause a malfunction of the two-dimensional photosensor or may damage it in the worst case. If the pattern of a fingerprint is copied onto a sheet by any means, since the reading apparatus is not equipped with any means for discriminating a sheet from a human finger, the apparatus determines matching so long as the pattern is the same. When this fingerprint matching is set as a log-in condition for a personal computer or a host computer of a network, the computer cannot be reliably protected from a third person's access.

BRIEF SUMMARY OF THE INVENTION

It is the first object of the present invention to provide a reading apparatus which prevents a photosensor from malfunction or damage by static electricity. It is the second object of the present invention to provide a reading apparatus capable of ensuring the reliability by reading a pattern after, e.g., detecting whether the object is man.

According to the present invention, there is provided a reading apparatus for reading a target object comprising: a photosensor module having a plurality of photosensors arranged at least one plane; and a transparent conductive layer provided between the target object and the photosensor module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION (First Embodiment)

Figure 1:
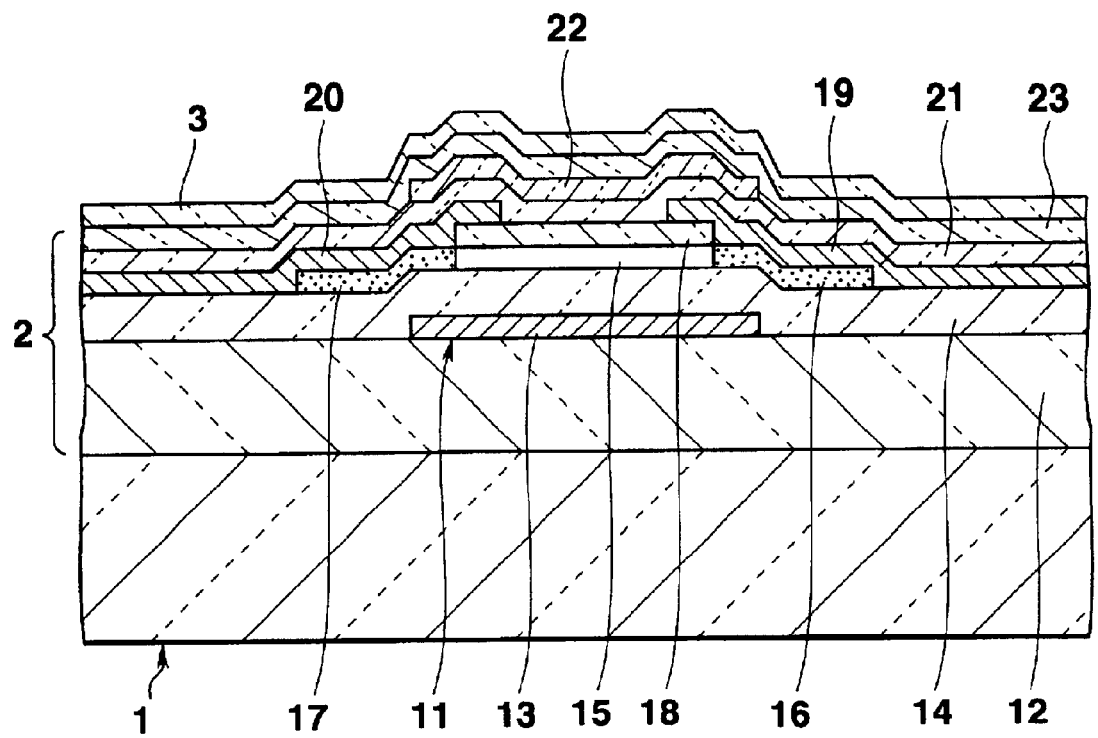
FIG. 1 is an enlarged sectional view of part of a fingerprint reading apparatus according to the first embodiment of the present invention.
Figure 2:
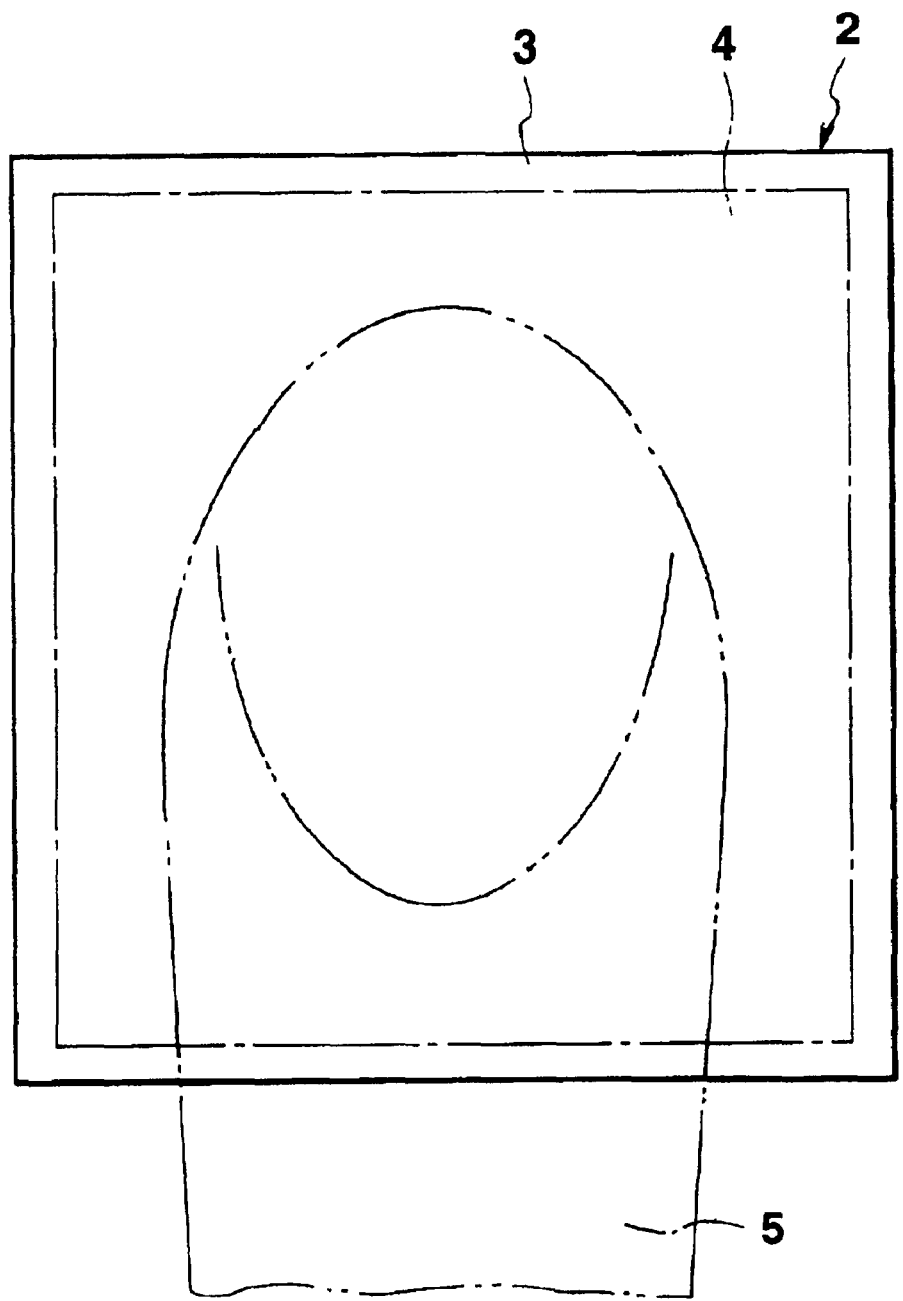
FIG. 2 is a plan view of part of the fingerprint reading apparatus shown in FIG. 1.

FIG. 1 is a sectional view of part of a reading apparatus according to the first embodiment of the present invention. This reading apparatus can read a target object in any form having a fine recessed or projecting pattern. In the following embodiment, the reading apparatus will exemplify a fingerprint reading apparatus for reading a fingerprint. This fingerprint reading apparatus has a two-dimensional photosensor (photosensor device) 2 on a surface light source 1. A transparent conductive layer 3 made of ITO or the like is formed on the two-dimensional photosensor 2. The surface light source 1 is formed of an electro-luminescence or formed as an edge light type backlight used in a liquid crystal display device. Although not shown, the edge light type backlight typically has a light-reflecting plate on the lower surface of a light guide plate, one or several point light sources such as light-emitting diodes are disposed next to the light guide plate, and a surface of the point light source that does not correspond to the light guide plate is covered with a light-reflecting sheet. The transparent conductive layer 3 dissipates static electricity and is grounded in a given region (not shown). The transparent conductive layer 3 is formed by, e.g., deposition on the upper surface of an overcoat film 23 (to be described later) of the two-dimensional photosensor 2. The transparent conductive layer 3 is formed slightly larger than a square sensor region 4 of the two-dimensional photosensor 2 indicated by the one-dot chain line in FIG. 2. Note that the two-dot chain line in FIG. 2 represents a finger 5.

The two-dimensional photosensor 2 will be described. The two-dimensional photosensor 2 has a structure in which a plurality of photosensors 11 (only one photosensor is shown in FIG. 1) are arranged in a matrix. The two-dimensional photosensor 2 has a transparent substrate 12 made of an acrylic resin, glass or the like. A bottom gate electrode 13 serving as a light-shielding electrode made of chromium or aluminum is formed for each photosensor 11 on the upper surface of the transparent substrate 12. A light-transmitting bottom gate insulating film 14 made of silicon nitride is formed on the entire upper surface of the bottom gate electrode 13 and the upper surface of the transparent substrate 12. A semiconductor layer 15 made of amorphous silicon is formed on an upper surface portion of the bottom gate insulating film 14 which corresponds to the bottom gate electrode 13. $n^+$-type silicon layers 16 and 17 are respectively formed on the two sides of the semiconductor layer 15 on the upper surface of the bottom gate insulating film 14. A light-transmitting blocking layer 18 made of silicon nitride is formed on the upper surface of the semiconductor layer 15. Source and drain electrodes 19 and 20 as light-shielding electrodes made of chromium or aluminum are formed on the two sides of the upper surface of the blocking layer 18, the upper surfaces of the $n^+$-type silicon layers 16 and 17, and the upper surface of the bottom gate insulating film 14. A light-transmitting top gate insulating film 21 made of silicon nitride is formed on the entire upper surfaces of the source and drain electrodes 19 and 20 and the exposed surface of the blocking layer 18. A top gate electrode 22 as a transparent electrode made of ITO or the like is formed on an upper surface portion of the top gate insulating film 21 which corresponds to the semiconductor layer 15. A light-transmitting overcoat film 23 made of silicon nitride is formed on the entire upper surface of the top gate electrode 22 and the upper surface of the insulating film 21. In this two-dimensional photosensor 2, when a light beam is incident at random from the lower surface side, one part of the light beam is shielded by the bottom gate electrode 13, and the other part of the light beam passes through the light-transmitting layers excluding the source and drain electrodes 19 and 20, so that the light beam is not directly incident on the semiconductor layer 15.

Operation of this fingerprint reading apparatus will be explained in short. A light beam emitted from the upper surface of the surface light source 1 passes through the light-transmitting portion of the two-dimensional photosensor 2 and the transparent conductive layer 3. The finger 5 (see FIG. 2) in contact with the transparent conductive layer 3 is irradiated with this transmitted light beam at random from the lower surface side. The light beam reflected by the surface of the finger 5 passes through the transparent conductive layer 3 and the neighboring top gate electrode 22 serving as a transparent electrode, and is incident on the incident surface (exposed surface) of the semiconductor layer 15 between the source and drain electrodes 19 and 20. In this case, portions corresponding to projections (ridges) of the skin surface of the finger 5 in contact with the surface of the transparent conductive layer 3 become bright. Portions corresponding to recesses (valleys) of the skin surface of the finger 5 become dark. As a result, an image whose contrast is optically emphasized in accordance with the ridges and valleys of the skin surface of the finger 5 can be obtained to read the fingerprint of the finger 5.

In this fingerprint reading apparatus, since the transparent conductive layer 3 is formed and grounded on the two-dimensional photosensor 2, static electricity discharged from the finger 5 in contact with the transparent conductive layer 3 on the two-dimensional photosensor 2 can dissipate via the transparent conductive layer 3. This can prevent the two-dimensional photosensor 2 from malfunction or damage by this static electricity.

Figure 3:
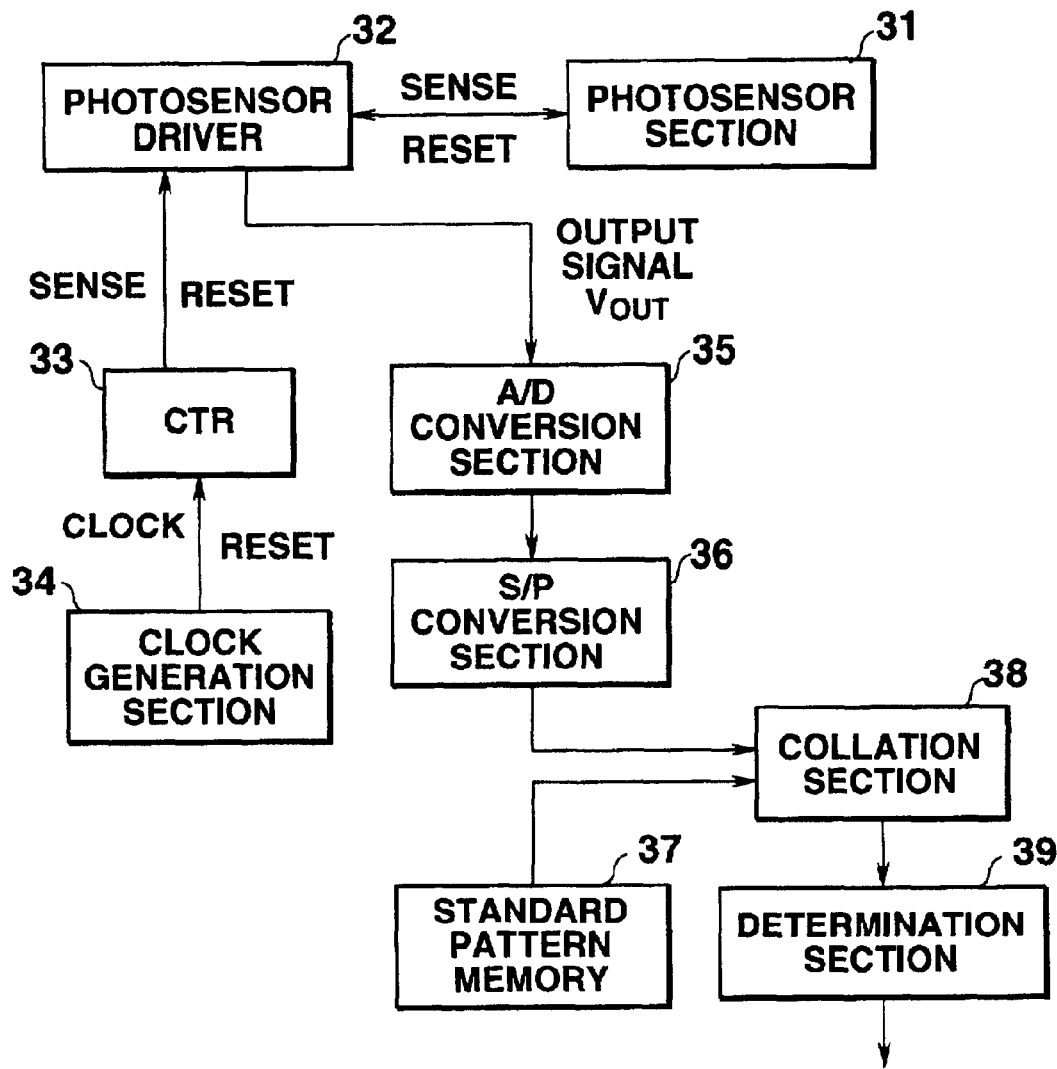
FIG. 3 is a block diagram of the fingerprint reading apparatus shown in FIG. 1.

FIG. 3 is a block diagram showing part of the fingerprint reading apparatus. This fingerprint reading apparatus comprises a photosensor section 31, a photosensor driver 32, a CTR (controller) 33, a clock generation section 34, an A/D (analog-to-digital) conversion section 35, an S/P (serial-to-parallel) conversion section 36, a standard pattern memory 37, a collation section 38, a determination section 39, and the like.

Figure 4:
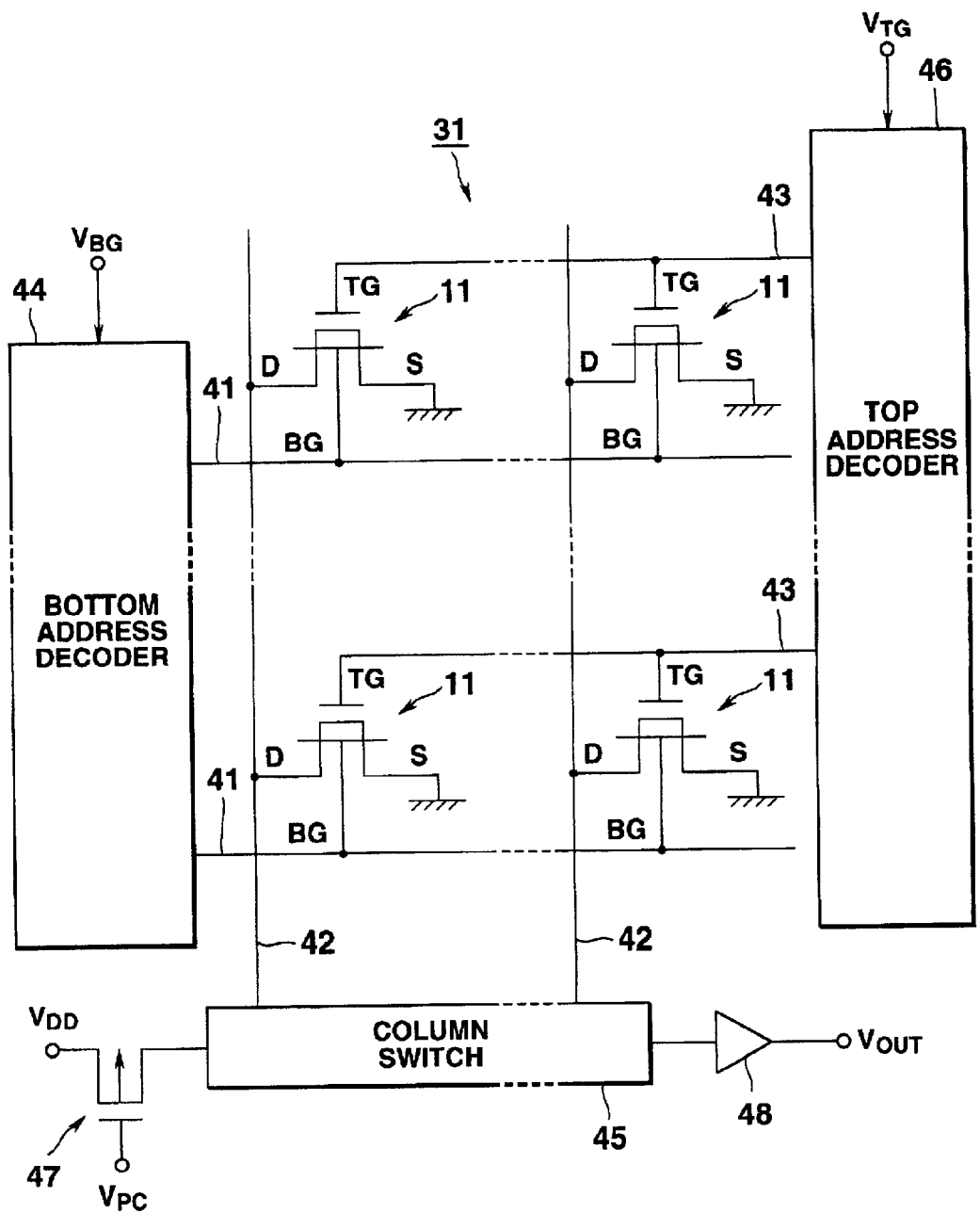
FIG. 4 is a circuit diagram of a photosensor section and photosensor driver shown in FIG. 3.
Figure 5:
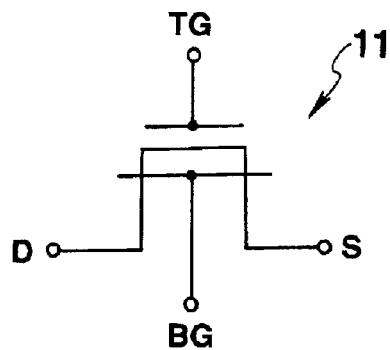
FIG. 5 is an equivalent circuit diagram of a single photosensor shown in FIG. 1.
Figure 6A:
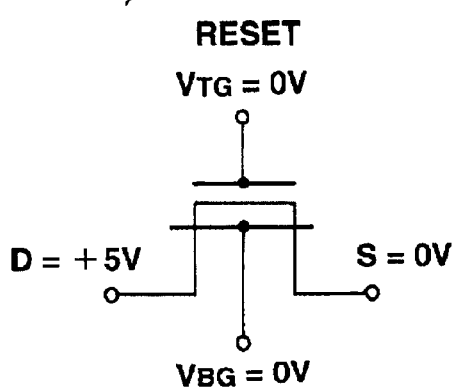
FIGS. 6A to 6D are circuit diagrams for explaining changes in voltage applied to each electrode of the photosensor shown in FIG. 5 and state of the photosensor.
Figure 6B:
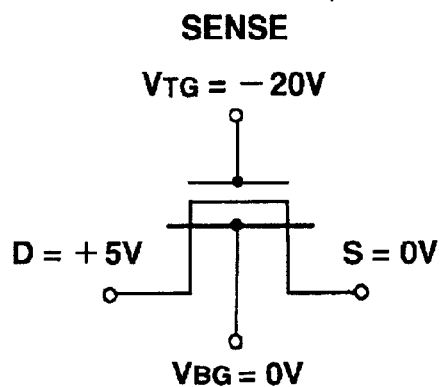
Figure 6C:
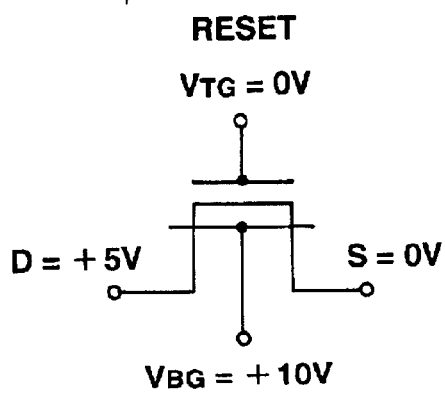
Figure 6D:
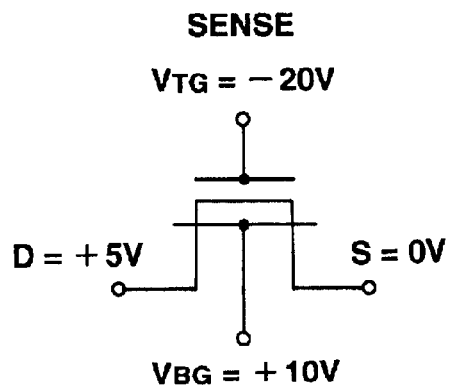

As shown in FIG. 4, the photosensor section 31 has a structure in which the photosensors 11 constituting the two-dimensional photosensor shown in FIG. 1 are arranged in a matrix. As shown in FIG. 1, the photosensor has a bottom gate type transistor formed by the bottom gate electrode (BG) 13, semiconductor layer 15, source electrode (S) 19, drain electrode (D) 20, and the like, and a top gate type transistor formed by the top gate electrode (TG) 22, semiconductor layer 15, source electrode (S) 19, drain electrode (D) 20, and the like. That is, the photosensor is constituted by a photoelectric conversion thin-film transistor in which the bottom gate electrode (BG) 13 and top gate electrode (TG) 22 are respectively formed below and above the semiconductor layer 15. The equivalent circuit of this transistor is shown in FIG. 5.

Referring back to FIG. 4, the bottom gate electrode (BG) of each photosensor 11 is connected to one of a plurality of bottom electrode lines 41 extending in the row direction. The drain electrode (D) of each photosensor 11 is connected to one of a plurality of signal lines 42 extending in the column direction. The top gate electrode (TG) of each photosensor 11 is connected to one of a plurality of top electrode lines 43 extending in the row direction. The source electrode (S) of each photosensor 11 is grounded.

As shown in FIG. 4, the photosensor driver 32 shown in FIG. 3 comprises a bottom address decoder 44 serving as a vertical scanning circuit connected to the bottom electrode lines 41, a column switch 45 serving as a horizontal scanning circuit connected to the signal lines 42, and a top address decoder 46 connected to the top electrodes 43. The bottom address decoder 44 applies a bottom gate voltage $V_{BG}$ to the bottom gate electrodes (BG) of the photosensors 11 aligned on each row via a corresponding bottom electrode line 41. The top address decoder 46 applies a top gate voltage $V_{TG}$ to the top gate electrodes (TG) of the photosensors 11 aligned on each row via a corresponding top electrode line 43.

The column switch 45 receives a drain voltage $V_{DD}$ via a precharge transistor 47. The column switch 45 outputs an output signal $V_{OUT}$ via a buffer 48. Every time the precharge transistor 47 is turned on upon reception of a precharge voltage $V_{PC}$, the column switch 45 outputs an output from each photosensor 11 connected to a signal line 42 as the output signal $V_{OUT}$ via the buffer 48.

The clock generation section 34 shown in FIG. 3 includes an oscillation circuit and a frequency division circuit, and outputs clock and reset signals having predetermined frequencies to the CTR 33. The CTR 33 outputs the bottom and top gate voltages $V_{BG}$ and $V_{TG}$ as sense and reset signals to the photosensor driver 32 on the basis of the clock and reset signals input from the clock generation section 34, and outputs the precharge and drain voltages $V_{PC}$ and $V_{DD}$ to the precharge transistor 47 shown in FIG. 4.

The A/D conversion section 35 shown in FIG. 3 A/D-converts the output signal $V_{out}$ output from the photosensor section 31 via the photosensor driver 32 (i.e., the column switch 45 shown in FIG. 4). The S/P conversion section 36 converts the serial output signals from the A/D conversion section 35 into parallel output signals. Fingerprint image signals corresponding to fingerprints of a plurality of specific persons are stored as standard pattern signals in the standard pattern memory 37 in advance. The collation section 38 collates an output signal from the S/P conversion section 36 with standard pattern signals sequentially read out from the standard pattern memory 37, and outputs each collation signal to the determination section 39. The determination section 39 determines based on the collation signal from the collation section 38 whether a fingerprint image signal corresponding to the output signal $V_{OUT}$ from the photosensor section 31 matches the standard pattern signal of a specific person stored in the standard pattern memory 37 in advance, and outputs a determination signal.

Operation of the photosensor 11 will be described with reference to FIGS. 5 and 1. When a positive voltage (e.g., +10V) is applied to the bottom gate electrode (BG) while a positive voltage (e.g., +5V) is kept applied between the source electrode (S) and drain electrode (D) of the photosensor 11, a channel is formed in the semiconductor layer 15 to flow a drain current. In this state, when a negative voltage (e.g., −20V) having a level enough to make the channel formed by the electric field of the bottom gate electrode (BG) disappear is applied to the top gate electrode (TG), the electric field from the top gate electrode (TG) acts in a direction to eliminate the channel formed by the electric field of the bottom gate electrode (GB), thereby pinching off the channel. At this time, when the semiconductor layer 15 is irradiated with a light beam from the top gate electrode (TG) side, the electron-hole pairs are induced in the semiconductor layer 15 on the top gate electrode (TG) side. The electron-hole pairs are accumulated in the channel region of the semiconductor layer 15 to cancel the electric field of the top gate electrode (TG). A channel is then formed in the semiconductor layer 15 to flow the drain current. This drain current changes in accordance with a change in incident light amount of the semiconductor layer 15. As described above, in this two-dimensional photosensor 2, the electric field from the top gate electrode (TG) acts in a direction to prevent channel formation using the electric field of the bottom gate electrode (BG) to pinch off the channel. The drain current obtained when no light beam is incident can be greatly reduced, e.g., to about $10^{-14}$ A. The difference between the drain current obtained when no light beam is incident and the drain current obtained when a light beam is incident can be made sufficiently large. The amplification factor of the bottom gate type transistor at this time can change in accordance with a change in incident light amount to increase the S/N ratio.

In the two-dimensional photosensor 2, one photosensor 11 can have both a sensor function and a selection transistor function. These functions will be briefly described below. When a voltage of, e.g., 0V is applied to the top gate electrode (TG) while a positive voltage (+10V) is kept applied to the bottom gate electrode (BG), holes are discharged from the trap level between the semiconductor layer 15 and the top gate insulating film 21 to allow refresh or reset operation. More specifically, when the reading apparatus is continuously used, the trap level between the semiconductor layer 15 and the top gate insulating film 21 is buried with the holes generated upon irradiation and the holes injected from the drain electrode (D). A channel resistance set while no light beam is incident is reduced, and the drain current obtained when no light beam is incident increases. Therefore, the top gate electrode (TG) is set at 0V to discharge these holes to allow reset operation.

When the positive voltage is not applied to the bottom gate electrode (BG), no channel is formed in the bottom gate type transistor. Even if a light beam is incident, no drain current flows to set the nonselected state. More specifically, by controlling the voltage applied to the bottom gate electrode (BG), the selected state and the nonselected state can be controlled. In the nonselected state, when 0V is applied to the top gate electrode (TG), the holes can be discharged from the trap level between the semiconductor layer 15 and the top gate insulating film 21 to allow reset operation in the same manner as described above.

As a result, as shown in FIGS. 6A to 6D, for example, the top gate voltage $V_{TG}$ is controlled to 0V and −20V to allow control of the sensed state and the reset state. The bottom gate voltage $V_{BG}$ is controlled to 0V and +10V to allow control of the selected state and the nonselected state. That is, by controlling the top gate voltage $V_{TG}$ and the bottom gate voltage $V_{BG}$, one photosensor 11 can have both the function serving as a photosensor and the function serving as the selection transistor.

Operation of the two-dimensional photosensor 2 will be explained with reference to FIGS. 3 and 4. The clock generation section 34 outputs clock and reset signals having predetermined frequencies to the CTR 33. The CTR 33 outputs the bottom and top gate voltages $V_{BG}$ and $V_{TG}$ as sense and reset signals to the photosensor driver 32 on the basis of the clock and reset signals from the clock generation section 34, and outputs the precharge and drain voltages $V_{PC}$ and $V_{DD}$ to the precharge transistor 47.

Photosensors 11 on the first row are reset by setting the bottom and top gate voltages $V_{BG}$ and $V_{TG}$ to 0V. During this resetting, the precharge voltage $V_{PC}$ is applied to the precharge transistor 47 for a predetermined time, and the drain voltage $V_{DD}$ (+5V) is applied to all the signal lines 42 to precharge the photosensors 11. The top gate voltage $V_{TG}$ is set to −20V to change the photosensors 11 to a sense state. The bottom gate voltage $V_{BG}$ is set to +10V to change the photosensors 11 to a selected state. An output signal $V_{OUT}$ from each photosensor 11 changes to 0V or remains at +5V depending on the incident light quantity (light quantity). The output signal $V_{OUT}$ from each photosensor 11 is output from the column switch 45 via the buffer 48. The same operation is performed for photosensors 11 on the second to final rows. A description of the subsequent operation will be omitted.

(Second Embodiment)

Figure 7:
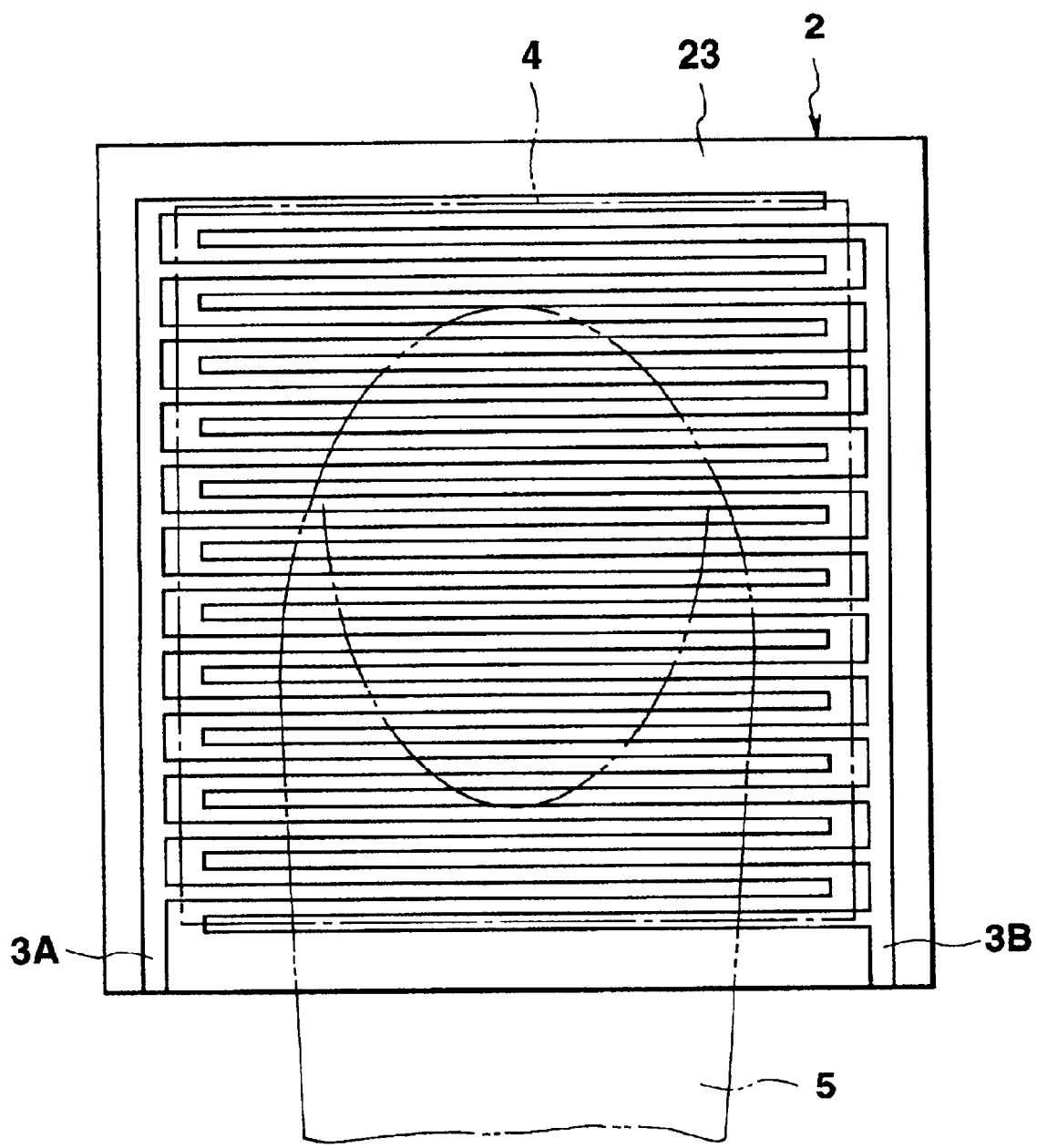
FIG. 7 is a plan view of part of a fingerprint reading apparatus according to the second embodiment of the present invention.

FIG. 7 is a plan view showing part of a fingerprint reading apparatus according to the second embodiment of the present invention. In this fingerprint reading apparatus, a pair of transparent conductive films 3A and 3B in a comb tooth shape are formed within and around a sensor region 4 on the upper surface of an overcoat film 23 of a two-dimensional photosensor 2. When a finger 5 touches the two-dimensional photosensor 2 including the pair of transparent conductive films 3A and 3B, the pair of transparent conductive films 3A and 3B detect the resistance of the touching finger 5 and start fingerprint reading operation by this detection signal (to be described later). The pair of transparent conductive films 3A and 3B can also have an antistatic function. The pair of transparent conductive films 3A and 3B are formed into a comb tooth shape in order to detect a relatively small resistance of the finger 5 with high sensitivity.

Figure 8:
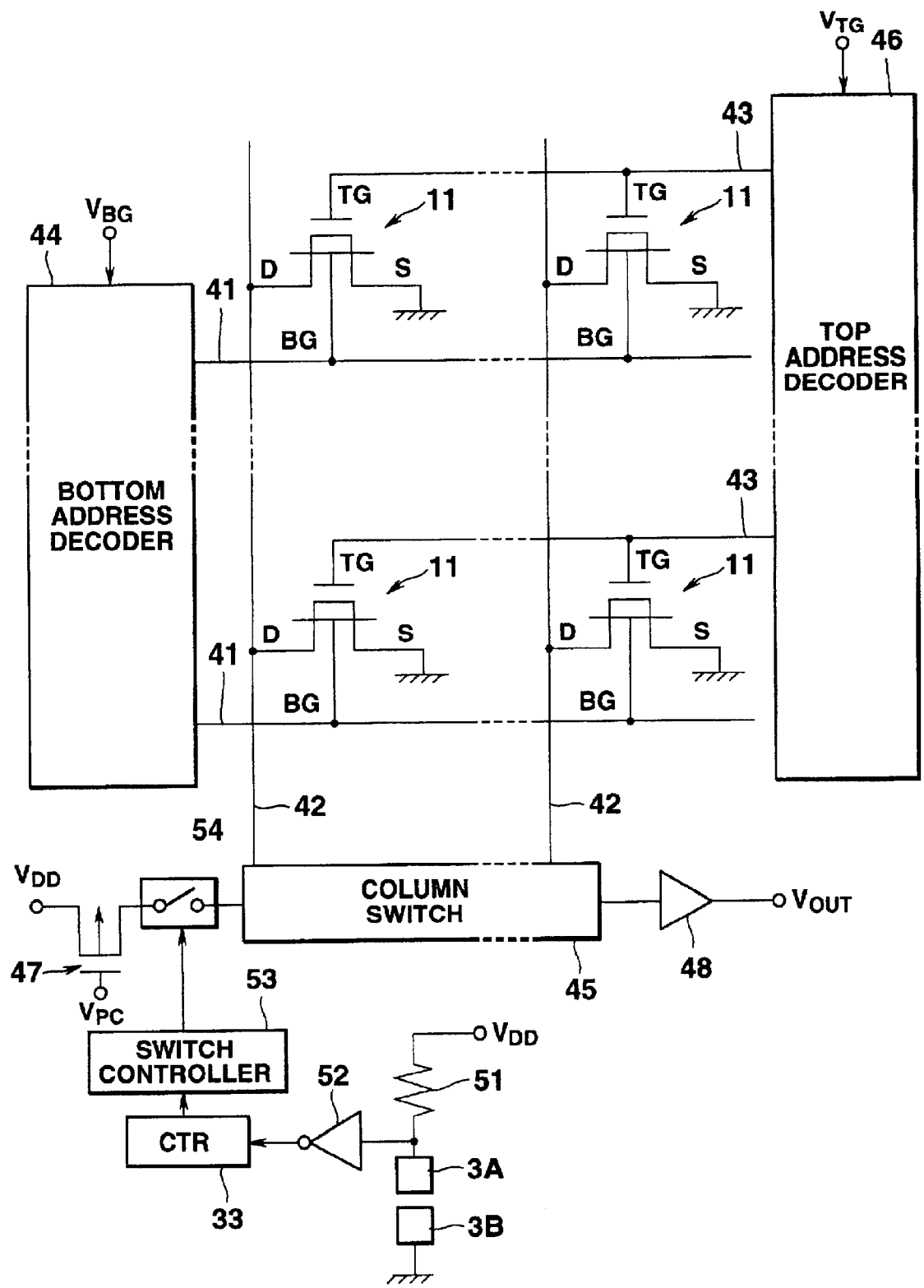
FIG. 8 is a circuit diagram of part of the fingerprint reading apparatus shown in FIG. 7.

FIG. 8 shows part of the circuit of the fingerprint reading apparatus. In FIG. 8, the same reference numerals as in FIG. 4 denote the same parts, and a description thereof will be properly omitted. One transparent conductive film 3A is connected via a resistor 51 to a CTR 33 (see FIG. 3) for outputting the drain voltage $V_{DD}$, whereas the other transparent conductive film 3B is grounded. The CTR 33 is connected between one transparent conductive film 3A and the resistor 51 via an inverter 52. The CTR 33 outputs a switching signal to a switch controller 53 upon reception of an H-level signal from the inverter 52. The switch controller 53 outputs a switch control signal to a switch 54 upon reception of the switching signal from the CTR 33. The switch 54 is a normally open switch formed between a column switch 45 and a precharge transistor 47.

In the fingerprint reading apparatus, when the finger 5 touches the two-dimensional photosensor 2 including the pair of transparent conductive films 3A and 3B, a resistance corresponding to a touch portion of the finger 5 is generated between the pair of transparent conductive films 3A and 3B to decrease the potential between the transparent conductive film 3A and the resistor 51 to a potential divided by the resistor 51 and the resistance value of the finger. The input of the inverter 52 falls from H level to L level to change the output of the inverter 52 to H level, and this H-level signal is output to the CTR 33. The CTR 33 outputs a switching signal to the switch controller 53 upon reception of the H-level signal from the inverter 52. Upon reception of the switching signal from the CTR 33, the switch controller 53 outputs a switch control signal to the switch 54 to close the switch 54. Then, the column switch 45 is connected to the precharge transistor 47 via the switch 54 to set the same state as shown in FIG. 4 and start fingerprint reading operation.

As described above, in the fingerprint reading apparatus, when the finger 5 touches the two-dimensional photosensor 2 including the pair of transparent conductive films 3A and 3B, the resistance of the touching finger 5 is detected to start fingerprint reading operation by this detection signal. Fingerprint reading operation can start automatically, conveniently. Since the other transparent conductive film 3B applied to most of the sensor region 4 of the two-dimensional photosensor 2 is grounded, as shown in FIG. 7, the antistatic function is enhanced. Note that when, for example, a copying sheet on which a fingerprint image of the finger 5 is copied is placed on the two-dimensional photosensor 2 including the pair of transparent conductive films 3A and 3B, no resistance is detected by the pair of transparent conductive films 3A and 3B because the copying sheet is insulated, and thus illicit use by the copying sheet can be prevented.

(Third Embodiment)

Figure 9:
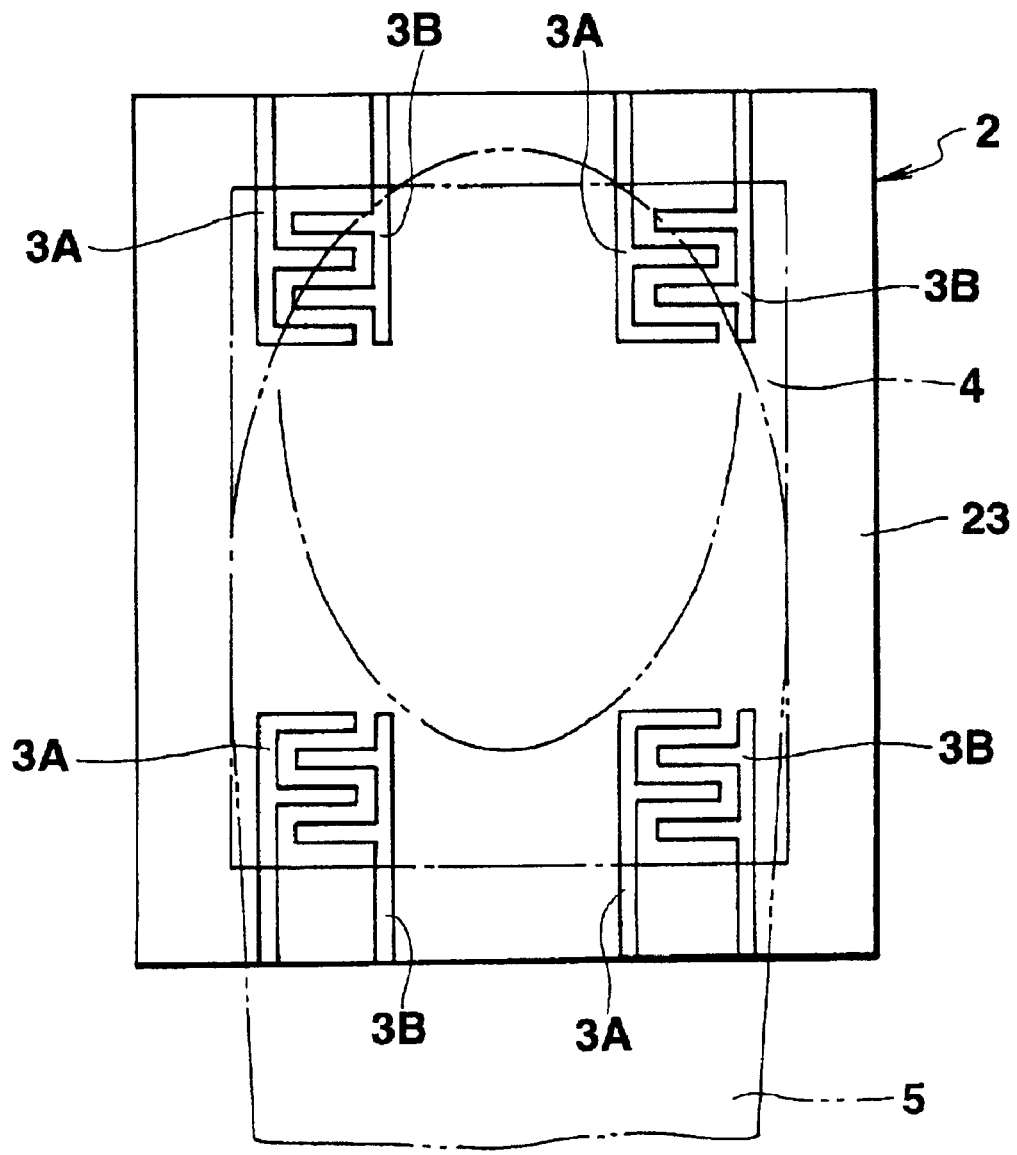
FIG. 9 is a plan view of part of a fingerprint reading apparatus according to the third embodiment of the present invention.

FIG. 9 is a plan view of part of a fingerprint reading apparatus according to the third embodiment of the present invention. In this fingerprint reading apparatus, pairs of transparent conductive films 3A and 3B in a comb tooth shape are respectively formed on the four corners of a square sensor region 4 on the upper surface of an overcoat film 23 of a two-dimensional photosensor 2. When a finger 5 touches the two-dimensional photosensor 2 including the four pairs of transparent conductive films 3A and 3B, the four pairs of transparent conductive films 3A and 3B detect the resistance of the touching finger 5 and start fingerprint reading operation by this detection signal (to be described later). These pairs of transparent conductive films 3A and 3B can also have an antistatic function.

Figure 10:
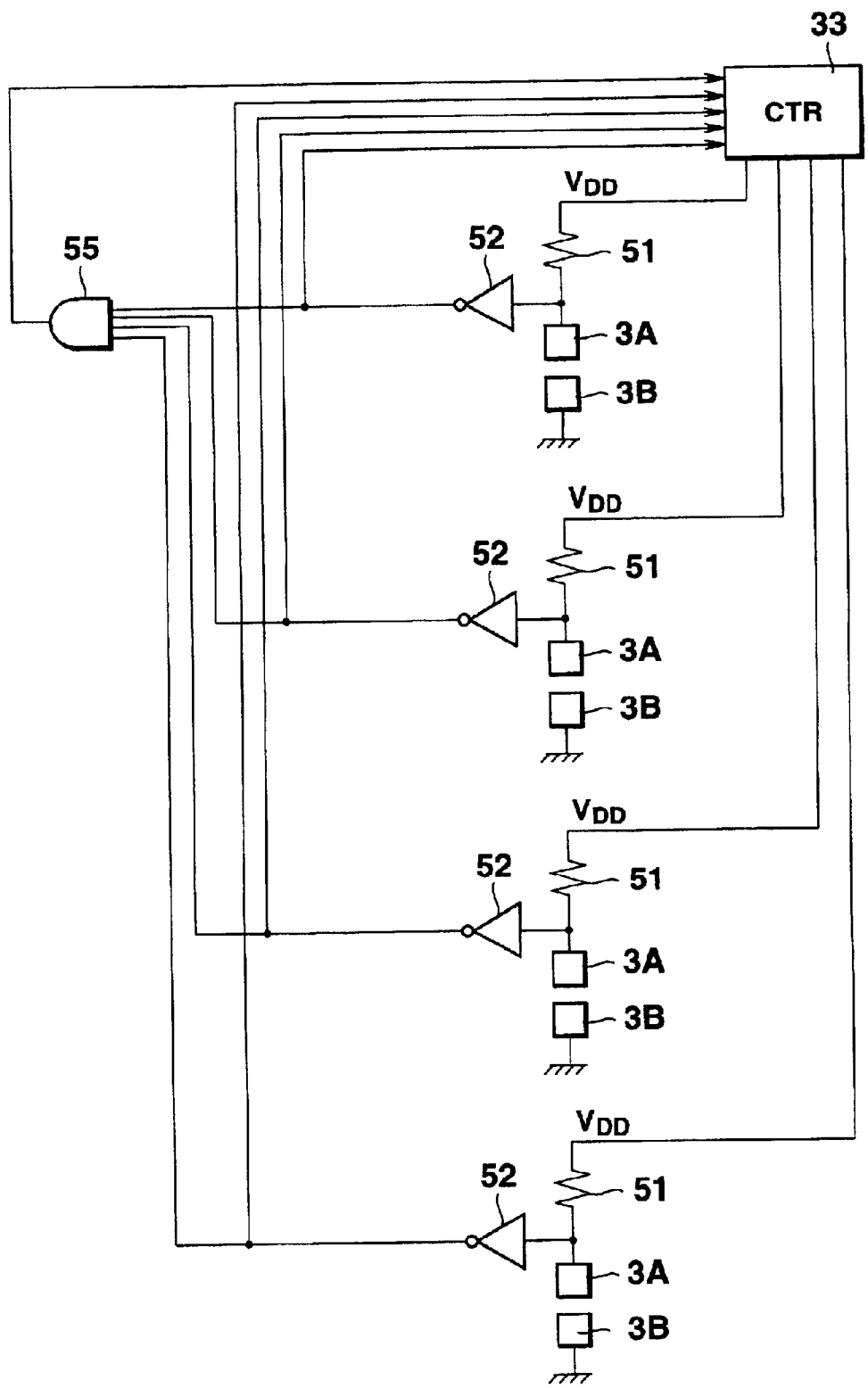
FIG. 10 is a circuit diagram of part of the fingerprint reading apparatus shown in FIG. 9.

FIG. 10 shows main part of the circuit of the fingerprint reading apparatus. In FIG. 10, the same reference numerals as in FIG. 8 denote the same parts, and a description thereof will be properly omitted. The output sides of four inverters 52 corresponding to the four pairs of transparent conductive films 3A and 3B are connected to both a CTR 33 and the input side of one AND circuit 55. The output side of the AND circuit 55 is connected to the CTR 33.

In this fingerprint reading apparatus, when the finger 5 touches the two-dimensional photosensor 2 including the four pairs of transparent conductive films 3A and 3B, resistances corresponding to touch portions of the finger 5 are generated between the respective pairs of transparent conductive films 3A and 3B, the outputs from the four inverters 52 change from L-level signals to H-level signals, and these H-level signals are output to the AND circuit 55. When the AND circuit 55 receives the H-level signals from all the four inverters 52, it outputs an AND signal to the CTR 33. In this case, the inverters 52 directly output the H-level signals to the CTR 33, but the CTR 33 ignores these H-level signals. Referring to FIG. 8, the CTR 33 outputs a switching signal to a switch controller 53 upon reception of the AND signal from the AND circuit 55. Upon reception of the switching signal from the CTR 33, the switch controller 53 outputs a switch control signal to a switch 54 to close the switch 54. Then, a column switch 45 is connected to a precharge transistor 47 via the switch 54 to set the same state as shown in FIG. 4 and start fingerprint reading operation.

In this fingerprint reading apparatus, when the touch position and state (whether the finger 5 touches appropriately) of the finger 5 with respect to the sensor region 4 of the two-dimensional photosensor 2 is erroneous, i.e., the finger 5 does not touch all the four pairs of transparent conductive films 3A and 3B, the AND circuit 55 outputs no AND signal. In this case, the finger 5 touches one to three pairs of transparent conductive films 3A and 3B out of the four pairs of transparent conductive films 3A and 3B, and inverters 52 corresponding to the pairs of transparent conductive films 3A and 3B touched by the finger 5 output H-level signals to the CTR 33. The CTR 33 outputs a finger touch error signal to a controller (not shown) on the basis of the absence of the AND signal from the AND circuit 55 and the presence of the H-level signals from the inverters 52. The controller informs the operator of the erroneous touch position or state of the finger 5 with respect to the sensor region 4 of the two-dimensional photosensor 2 by any informing means such as a display "please place your finger again" or voice.

Modification of Third Embodiment

Figure 11:
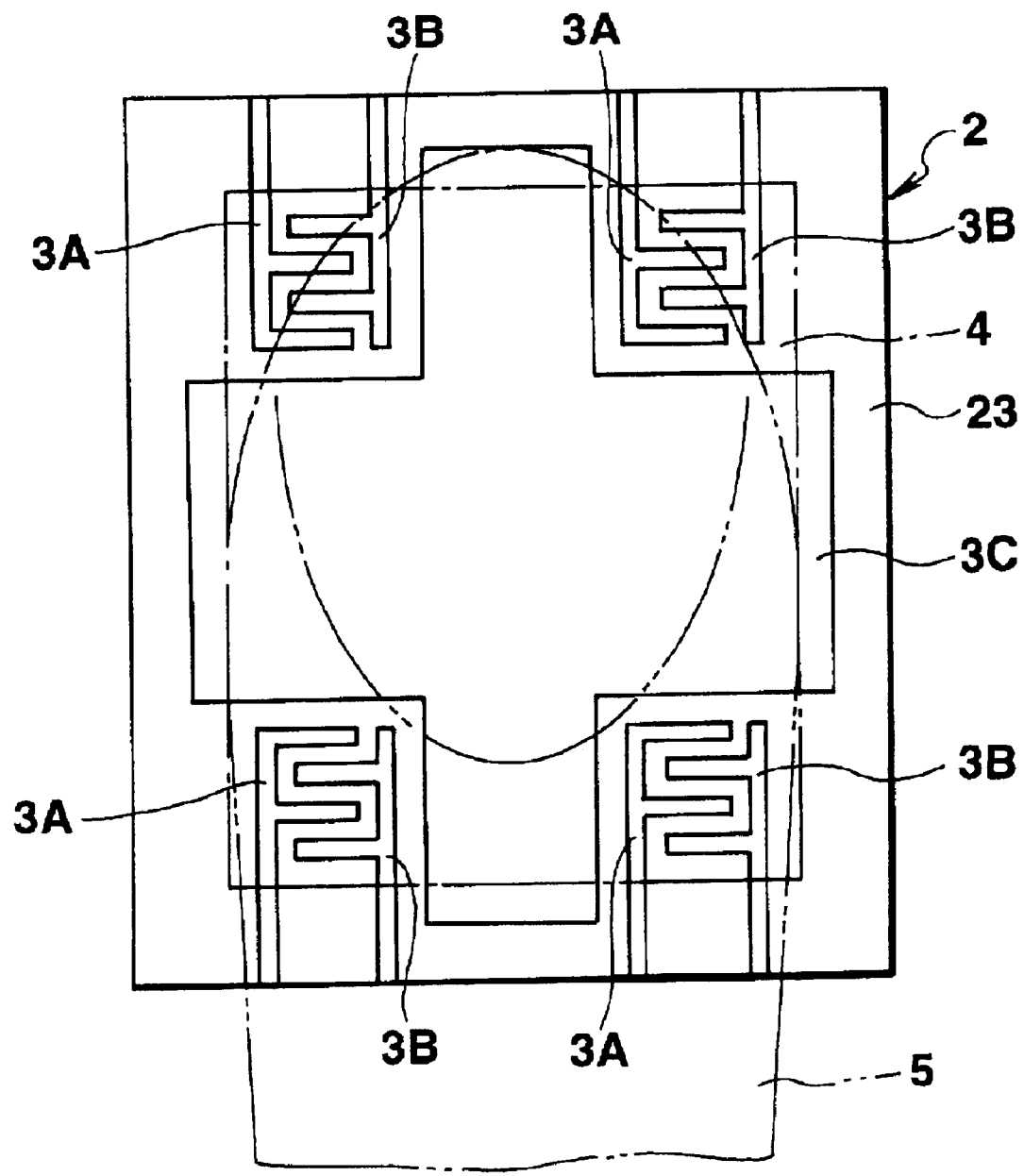
FIG. 11 is a plan view showing a modification of the fingerprint reading apparatus shown in FIG. 9.

This fingerprint reading apparatus can exhibit an antistatic function because the other transparent conductive film 3B of each pair is grounded as shown in FIG. 10. In the third embodiment, however, the central portion in the sensor region 4 is less resistant to static electricity because the pairs of transparent conductive films 3A and 3B are respectively formed at the four corners of the square sensor region 4 on the two-dimensional photosensor 2, as shown in FIG. 9. Therefore, for example, an electrostatic dissipation transparent conductive film 3C in an almost cross shape may be formed at the central portion in the sensor region 4, as shown in FIG. 11.

Note that in the fingerprint reading apparatus in FIG. 1, the transparent substrate 12 is placed on the surface light source 1, and the photosensor section 31 having photoelectric conversion thin-film transistors is formed on the transparent substrate 12. Alternatively, the transparent substrate 12 may be omitted, and the photosensor section 31 having photoelectric conversion thin-film transistors may be directly formed on a light guide plate constituting the surface light source 1. Each photosensor is not limited to the double gate type photoelectric conversion thin-film transistor described in the above embodiments, and may be a single gate type thin-film transistor or diode type thin-film transistor.

As has been described above, according to the aforementioned embodiment, since the transparent conductive layer formed on the photosensor device has an electrostatic dissipation function, even if, e.g., a finger in contact with the transparent conductive layer on the photosensor device is charged with static electricity, this static electricity can dissipate via the transparent conductive layer. The photosensor device can be prevented from malfunction or damage by the static electricity. In addition, a pair of transparent conductive layers are formed apart from each other. The resistance value of a target object placed between the conductive layers is measured to determine whether the resistance value falls within a predetermined range. Only when collation is attained, collation starts. Collation using a copy can be avoided to improve the reliability.

(Fourth Embodiment)

A description will now be given of a photosensor including double-gate transistors and applied to a two-dimensional reading apparatus according to the fourth embodiment. The description will be given with reference to the drawings.

Figure 12A:
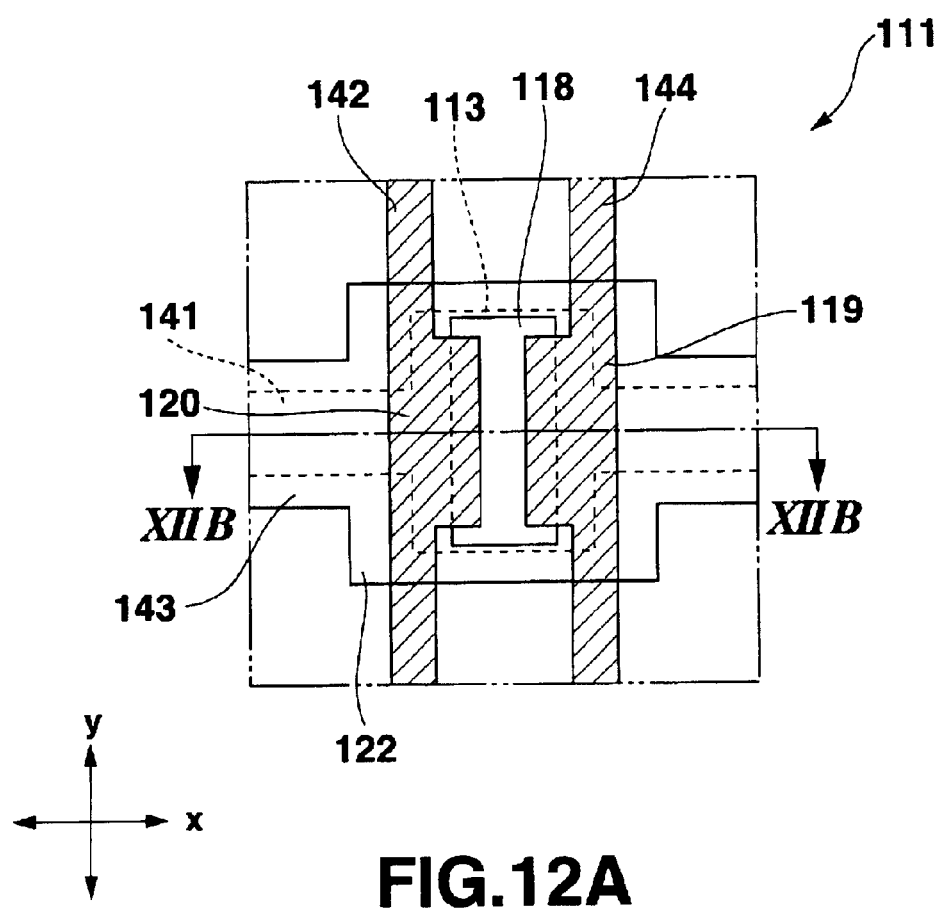
FIG. 12A is a schematic view showing the basic structure of a double-gate transistor.
Figure 12B:
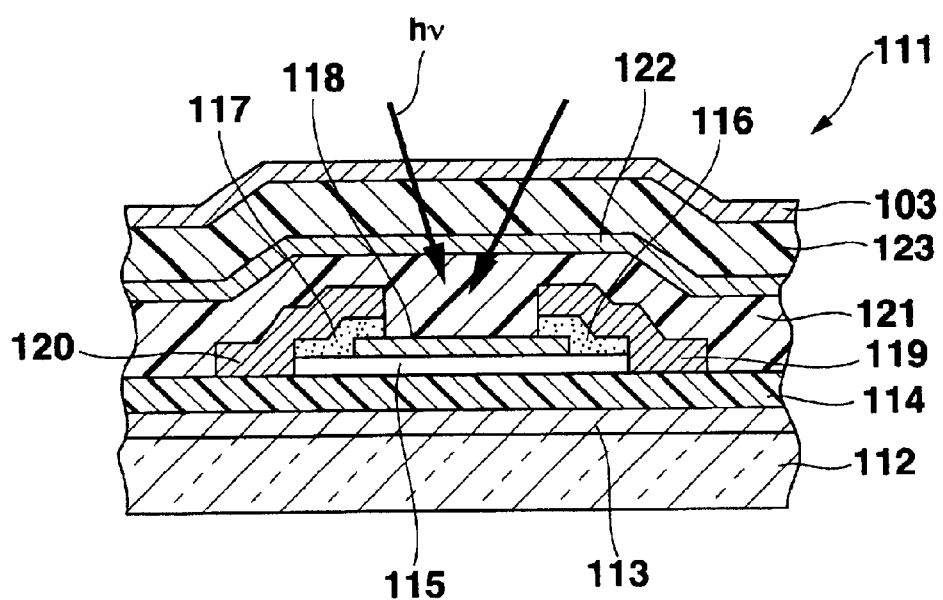
FIG. 12B is a sectional view taken along line XIIB—XIIB in FIG. 12A.

FIG. 12A is a schematic view showing the basic structure of a double-gate transistor, and FIG. 12B is a sectional view taken along line XIIB—XIIB in FIG. 12A.

As shown in FIGS. 12A and 12B, the double-gate transistor 111 comprises the following: a semiconductor layer (a channel layer) 115 which is formed of amorphous silicon or the like and which generates electron-hole pairs in response to irradiation of excitation light (visible light in this embodiment); impurity-doped layers 116 and 117 formed of $n^-$ or $n^+$-type silicon and located at the respective ends of semiconductor layer 115; a source electrode 119 and a drain electrode 120 located on the impurity-doped layers 116 and 117, respectively, the source and drain electrodes 119 and 120 being formed of chromium, a chromium alloy, aluminum, an aluminum alloy, or the like, and preventing visible light to pass therethrough; a top gate electrode 122 located above the semiconductor layer 115 (as viewed in FIG. 12A) and permitting visible light to pass therethrough, the top gate electrode 122 being made of a transparent conductive film, such as ITO film, and formed in such a manner that a block insulating film 118 and a top gate insulating film 121 are interposed between the top gate electrode and the semiconductor layer; and a bottom gate electrode 113 which is located under the semiconductor layer 115 and prevents visible light from passing therethrough, the bottom gate electrode 113 being formed of chromium, a chromium alloy, aluminum, an aluminum alloy, or the like, and formed in such a manner that a bottom gate insulating film 114 is interposed therebetween. The double-gate transistor 111 of this structure is formed on an insulating transparent substrate 112 such as a glass substrate. In FIG. 12A, reference numeral 143 denotes a top gate line, numeral 141 denotes a bottom gate line, numeral 142 denotes a drain line, and numeral 144 denotes a source line.

The top gate insulating film 121, the block insulating film 118, the bottom gate insulating film 114 and the protective insulating film 123 on the top gate electrode 122, all of which are shown in FIG. 12B, are formed of an insulating material that provides a large transmission factor with respect to the visible light used for exciting the semiconductor layer 115. Those insulating films are formed of silicon nitride or silicon oxide, for example. A transparent conductive layer 103 is formed on the protective insulating film 123. The transparent conductive layer 103 is formed of a material that provides a large transmission factor with respect to the visible light used for exciting the semiconductor layer 115. For example, the conductive layer 103 is made of ITO. With this structure, light hv is incident on the semiconductor layer 115 from above, as indicated by the arrows in FIG. 12B.

A photosensor system that comprises a photosensor array including two-dimensionally arranged double-gate transistors 111 (each having a structure as described above) will be briefly described with reference to the drawings.

Figure 13:
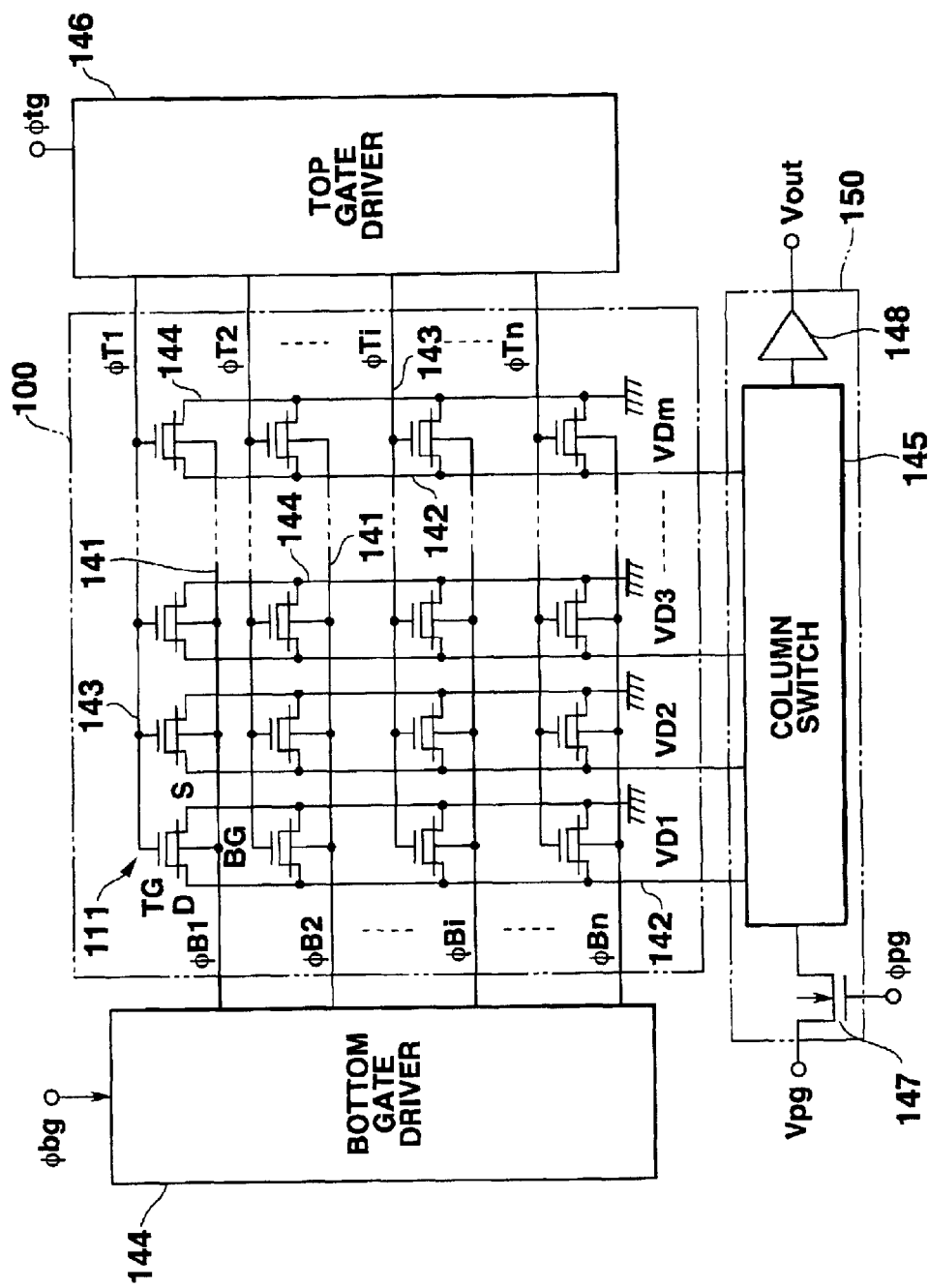
FIG. 13 is a schematic diagram showing a photosensor system that comprises a photosensor array including a plurality of double-gate transistors.

FIG. 13 is a schematic diagram showing the photosensor system that comprises a photosensor array 100 including a large number of double-gate transistors 111. The double-gate transistors 111 are arranged in two dimensions or a matrix form. In FIG. 13, reference numeral "111" denotes an equivalent circuit of the double-gate transistor, reference symbol "TG" denotes a top gate terminal, "BG" denotes a bottom gate terminal, "S" denotes a source terminal, and "D" denotes a drain terminal.

Broadly speaking, the photosensor system comprises the following: the photosensor array 100 including a large number of double-gate transistors 111 which are arranged in two dimensions in a matrix pattern of (n rows×m columns); top and bottom gate lines 143 and 141, the top gate line 143 connecting the top gate terminals TG (top gate electrodes 122) of the double-gate transistors 111 together in the row direction and the bottom gate line 141 connecting the bottom gate terminals BG (bottom gate electrodes 113) of the double-gate transistors 111 together in the row direction; drain lines (data lines) 142 connecting the train terminals D (drain electrodes 120) of the double-gate transistors 111 together in the column direction; source lines 144 (common lines) connecting the source terminals S (source electrodes 119) together in the column direction; a top gate driver 146 connected to the top gate lines 143; a bottom gate driver 144 connected to the bottom gate lines 141; and a drain driver 150 including a column switch 145, which is connected to the drain lines 142, a precharge switch 147 and an amplifier 148.

The top gate lines 143 and the top gate electrodes 122 are integrally formed by use of a transparent conductive layer of ITO or the like. The bottom gate lines 141 are integral with the bottom gate electrodes 113 and are formed of a material that prevents excitation light from passing therethrough. The same holds true for the relationship between the drain lines 142 and drain electrodes 120 and the relationship between the source lines 144 and the source electrodes 119. The source lines 144 are applied with a constant voltage $V_{SS}$ which is determined in accordance with a precharge voltage (described later). Alternatively, the source lines 144 may be kept at a ground potential.

In FIG. 13, $\phi_{tg}$ denotes a control signal used for generating signals $\phi_{T1}, \phi_{T2}, \ldots, \phi_{Ti}, \ldots, \phi_{Tn}$ which are selectively output as either a resetting voltage or a photo carrier accumulating voltage. Likewise, $\phi_{bg}$ denotes a control signal used for generating $\phi_{B1}, \phi_{B2}, \ldots, \phi_{Bi}, \ldots, \phi_{Bn}$ which are selectively output as either a read voltage or a non-read voltage, and $\phi_{pg}$ denotes a precharge signal used for controlling the timing when the precharge voltage $V_{pg}$ is applied.

With the above configuration, a photo sense function is attained by applying signals $\phi_{Ti}$ (i=1, 2, ..., n) from the top gate driver 146 to the top gate terminals TG by way of the top gate lines 143. A selective readout function is attained by applying signals $\phi_{Bi}$ (i=1, 2, ..., n) from the bottom gate driver 144 to the bottom gate terminals BG by way of the bottom gate lines 141, fetching detection signals in the drain driver 150 by way of the drain lines 142, and producing outputs (Vout) as serial data or parallel data.

Figure 14:
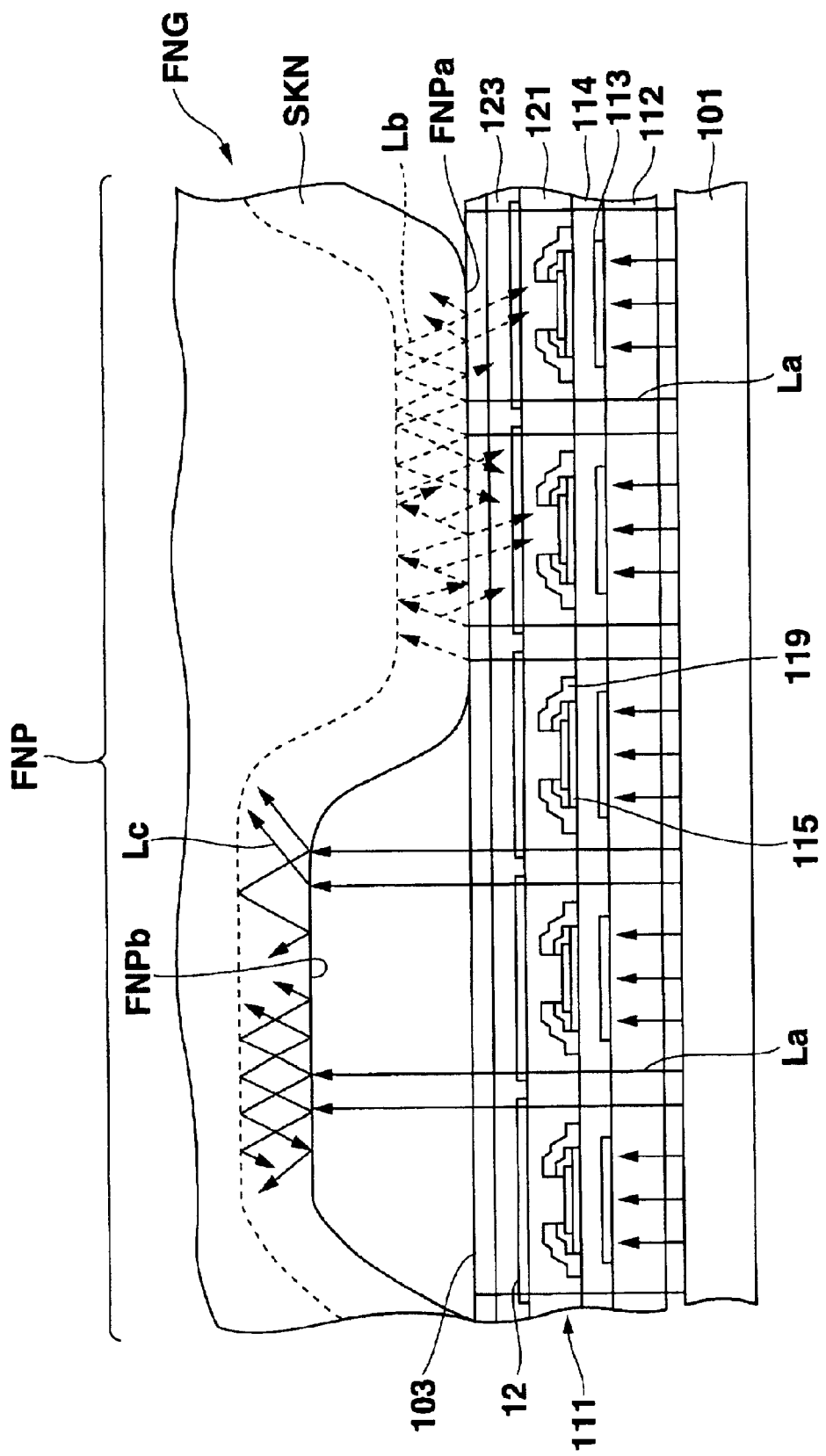
FIG. 14 is a sectional view showing a major portion and illustrating how light travels within a reading apparatus.

FIG. 14 is a sectional view showing a portion and illustrating how light travels within the two-dimensional reading apparatus described above.

A backlight system 101, which includes a light guide plate, a light diffuse plate and a fluorescent tube, is located under the photosensor array. The light emitted from the fluorescent tube is changed into a uniform planar illumination by use of the light guide plate and the light diffuse plate, and this beam is incident on the photosensor array.

To read a shadow pattern corresponding to a fingerprint by the reading apparatus, the fingerprint portion FNP of a finger FNG is placed on the reading apparatus. The fingerprint portion FNP has projections FNPa and recessions FNPb defined between the adjacent projections FNPa. At the time, the projections FNPa of the fingerprint portion FNP are in contact with the transparent conductive layer 103, while the recessions FNPb of the fingerprint portion FNP are not. In this state, the backlight system 101, which is located under the insulating transparent substrate 112 holding the photosensor array 100 thereon, emits illumination light La to the finger FNG. The illumination light La passes through the insulating transparent substrate 112 and the insulating films 114, 121 and 123, except for the areas where the double-gate transistors 111 are formed (more specifically, the areas where the bottom gate electrodes 113, the drain electrodes 120 and the source electrodes 119 are formed). The illumination light La is incident on the projections FNPa, which are in contact with the upper surface of the transparent conductive layer 103. The illumination light La is also incident on the recessions FNPb after passing through an air layer. The illumination light La from the backlight system 101 does not fall directly on the semiconductor layers 115 of the double-gate transistors 111 since the layers 115 are shielded by the bottom gate electrodes 113.

The projection FNPa of the finger FNG has a semitransparent outer skin layer SKN, which is the epidermis. When this skin layer SKN comes into contact with the transparent conductive layer 103 of the photosensor array 100, the air layer, which provides a small refractive index, is lost from the interface between the transparent conductive layer 103 and the outer skin layer SKN. Since the thickness of the outer skin layer SKN is greater than the value (800 nm or so) corresponding to the upper limit of visible value, the visible light La that is incident on the interior of the projections FNPa of the fingerprint portion FNP, travels within the outer skin layer SKN while simultaneously being diffused and reflected.

Part Lb of the diffused visible light is incident on the transparent conductive layer 103. This light Lb easily passes through the transparent conductive layer 103 since the refractive index nt of the transparent conductive layer 103 provides then (nt: a value in the range of 1.9 to 2.2) is greater than the refractive index na of the air (na: 1.0008). The visible light Lb emerging from the transparent conductive layer 103 passes through the transparent insulating films 123, 121 and 118 and the top gate electrodes 122, and is then incident on the semiconductor layers 115 of the double-gate transistors 111 as excitation light.

At positions corresponding to the recessions FNPb of the fingerprint portion FNP, the illumination light La passes through the interface between the air layer and the upper surface (detection surface) of the transparent conductive layer 103, and then reaches the finger FNG, which is ahead of the air layer. This light is diffused within the outer skin layer SKN. It should be noted that the refractive index of the outer skin layer SKN of the finger FNG is greater than that of the air and that the outer skin layer SKN therefore provides a wide critical angle. This being the case, most of the light Lc diffused within the outer skin layer SKN is reflected at the interface between the outer skin layer SKN and the air layer. In other words, the light Lc hardly travels into the air layer. Accordingly, the incidence of light on the semiconductor layers 115 of the double-gate transistors 111 is suppressed at positions corresponding to the recessions FNPb.

As described above, light is incident on the semiconductor layers 115 of the double-gate transistors 111 at positions corresponding to the projections FNPa of the finger FNG, and positive holes produced by the incident light are accumulated in the semiconductor layers 115. Hence, an image pattern corresponding to the projections and depressions of the finger FNG can be read as shade pattern information by the driving control method described above.

(Fifth Embodiment)

A description will now be given of a photosensor including double-gate transistors and applied to a two-dimensional reading apparatus according to the fifth embodiment. The reading apparatus of the fifth embodiment is similar to that of the fourth embodiment except that the backlight system 101 is not provided under the photosensor array 100.

Figure 15:
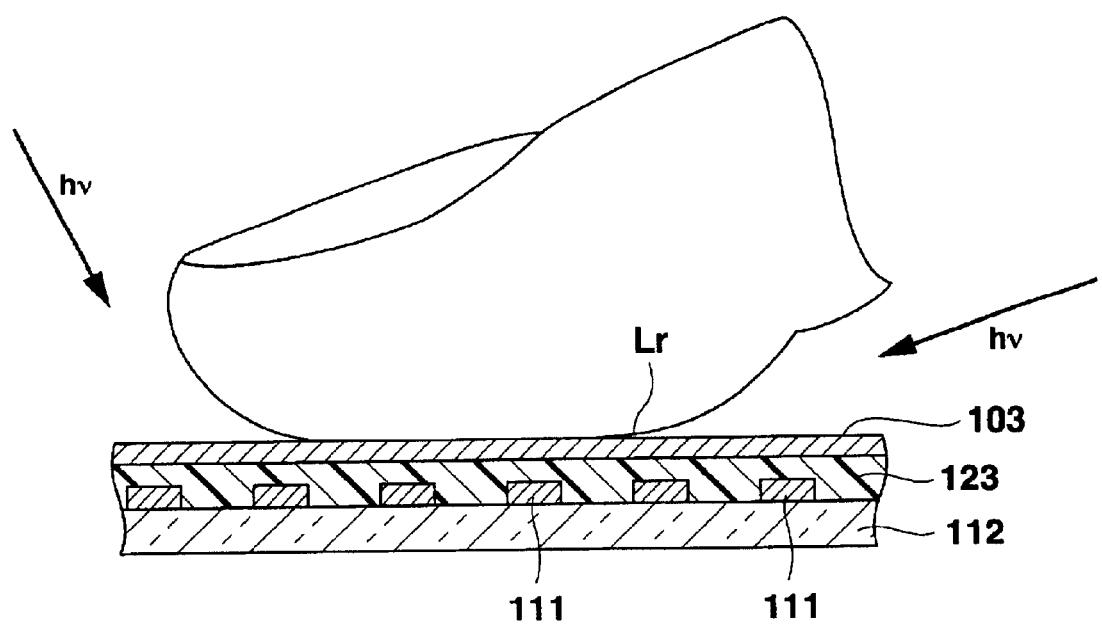
FIG. 15 is a sectional view showing a major portion and illustrating an optical path of another reading apparatus.

FIG. 15 is a sectional view showing a portion and illustrating an optical path of the reading apparatus described above. As can be seen from FIG. 15, the fifth embodiment uses the external light surrounding the reading apparatus and a target object, in place of the light emitted from the backlight system 101. The external light used in the fifth embodiment may be any kind of light, such as sunlight or an artificial illumination beam, as long as that light includes visible wavelength components. Shade pattern information can be read from a fingerprint if only the illumination of the external light is not smaller than 100 lx.

Figure 16:
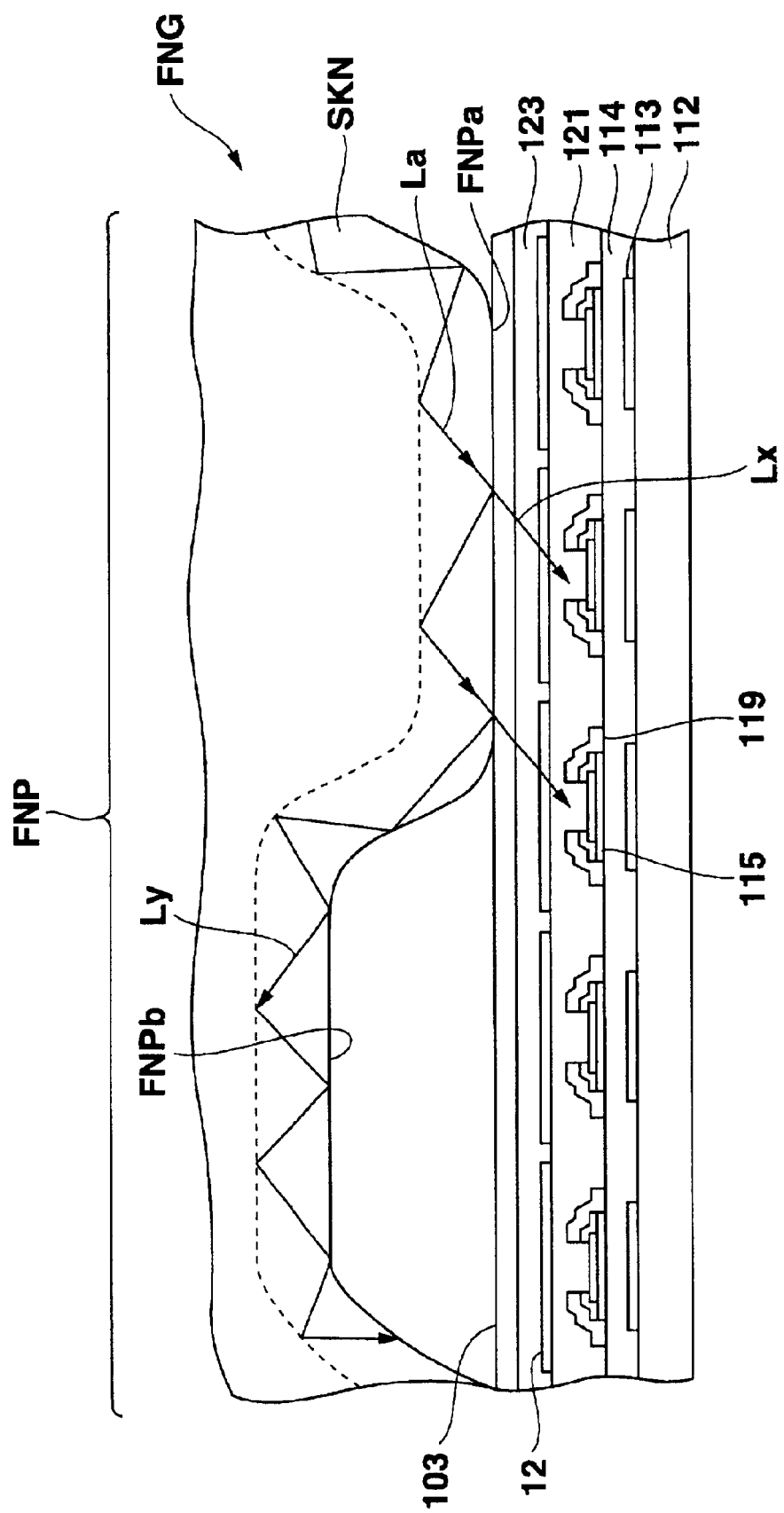
FIG. 16 is a sectional view showing a major portion and illustrating how light travels within the reading apparatus depicted in FIG. 15.

First of all, a fingerprint portion FNP, which has projections FNPa and recessions FNPb each defined between the adjacent projections FNPa, is placed on the reading apparatus. At the time, the semitransparent outer skin layer SKN of the projections FNPa of the fingerprint portion FNP is in contact with the transparent conductive layer 103 of the photosensor array 100, as shown in FIG. 16. Owing to this contact, the air layer, which provides a small refractive index, is lost from the interface between the transparent conductive layer 103 and the outer skin layer SKN. On the other hand, the outer skin layer SKN of the recessions FNPb of the fingerprint portion FNP is not in contact with the transparent conductive layer 103. Hence, an air layer exists between the outer skin layer SKN and the transparent conductive layer 103.

External light La, which is the ambient light, travels within the outer skin layer SKN while simultaneously being diffused and reflected. The thickness of the outer skin layer SKN is greater than the value (800 nm or so) corresponding to the upper limit of visible value. Part of the external light La can easily pass through the transparent conductive layer 103, which provides a greater refractive index than that of the air. After transmission through the conductive layer 103, light Lx passes through the transparent insulating films 123, 121 and 118 and the top gate electrodes 122, and is then incident on the semiconductor layers 115 of the double-gate transistors 111 as excitation light. As a result, positive holes are produced in the semiconductor layers 115.

Light Ly enters the outer skin layer SKN corresponding to the recessions FNPb of the fingerprint portion FNP, from the outer skin layer SKN corresponding to the adjacent depressions FNPa. Since the light Ly travels through the outer skin layer SKN while being repeatedly reflected by the air layer, which provides a small refraction factor, the incidence of light on the semiconductor layers 115 of the double-gate transistors 111 is suppressed at positions corresponding to the recessions FNPb of the fingerprint portion FNP.

In the manner described above, sufficiently-intense excitation light is incident on the semiconductor layers 115 of the double-gate transistors 111 only at positions corresponding to the projections FNPa of the finger FNG, and a sufficient amount of positive holes are produced there. Hence, an image pattern corresponding to the projections and depressions of the finger FNG can be read as shade pattern information by the driving control method described above.

It should be noted that when a target object (e.g., a finger) is placed on the transparent conductive layer, the target object can be electrostatically discharged to a ground potential through the transparent conductive layer. Thus, electrostatic discharge damage to both the double-gate transistors 111 and the driving circuits 144, 146 and 150 is prevented.

A description will now be given of an identification apparatus employing the reading apparatus of one of the first to fifth embodiments described above.

Figure 17:
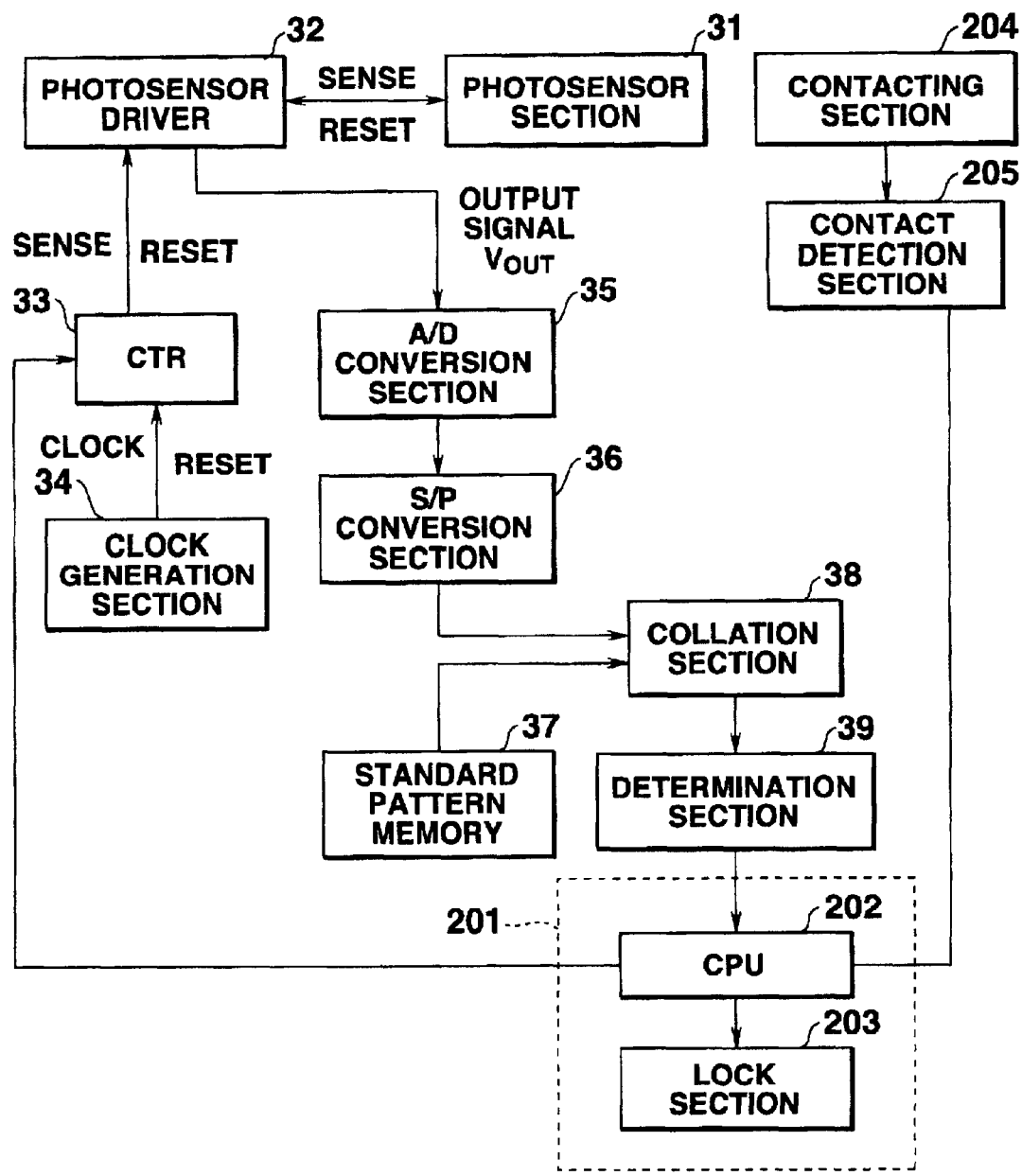
FIG. 17 is a block circuit diagram of a reading apparatus and an unlocking system, which unlocks in response to identification by the reading apparatus.

FIG. 17 is a block circuit diagram of a reading apparatus and a system, such as a portable information terminal, a personal computer, a network computer, etc. The reading apparatus is designed to identify a pre-registered person when this person wants to use or access the system. In FIG. 17, circuit blocks indicated by the same reference numerals as used in FIG. 3 have similar functions, and an explanation of the operation of such circuit blocks will be omitted.

The computer system 201 includes a CPU 202 and a lock section 203. A contacting section 204, which is made of the transparent conductive layer 103, is applied with a feeble pulse. This pulse changes at regular intervals, and its base voltage is 0(V). A contact detection section 205 reads the feeble pulse, and determines that a finger or another target object comes into contact with the contacting section 204 when it detects variations in the feeble pulse.

When a finger of a certain person touches the contacting section 204 of the reading apparatus, the contacting section 204 outputs a pulse which is delayed or changed in shape in accordance with the resistance or capacitance of the finger portion touching the contacting section 204. The output is supplied to the contact detection section 205. In addition, electrostatic discharge also occurs. When the input pulse is within a predetermined delay range or deformation range of pre-registered type of data (e.g., data on a human finger), the contact detection section 205 supplies a contact confirmation signal to the CPU 202 to notify it that a target object represented by the pre-registered type of data has been placed. Upon receipt of the contact confirmation signal, the CPU actuates a CTR 33 and starts the driving of a photosensor section 31 and a backlight system 101. On the basis of a determination signal supplied from the determination section 39, the CPU 202 outputs a permission signal that permits the person to use or access the computer. The permission signal is supplied to a lock section 203 and a display section (not shown), to unlock the lock by a lock section 203, and the display section is made to indicate this permission. Alternatively, a non-permission signal is output to the display section, thereby indicating the non-permission to the person.

The photosensor section 31, photosensor driver 32, CTR 33, clock generation section 34, A/D conversion section 35, S/P conversion section 36, standard pattern memory 37, collation section 38, determination section 39, contacting section 204 and contact detection section 305 were described as being independent of the computer system 201. The present invention is not limited to this structure. Of the structure elements described above, one or more may be provided within the computer system 201.

The computer system 201 described above is applicable to an automatic door system provided for a gate or a room. To be more specific, when the information read by the photosensor section 31 agrees with one of the information stored in the standard pattern memory 37 within an allowable range, a determination signal indicating this agreement is supplied from the determination section 39 to the CPU 202. On the basis of the determination signal, the gate or door is automatically locked or unlocked.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reading apparatus for reading a fingerprint of a finger comprising:
   a photosensor module having a plurality of photosensors arranged in at least one plane;
   a transparent conductive layer provided between the finger and the photosensor module; and
   a light source emitting a light incident on the finger,
   wherein said plurality of photosensors read an amount of light from a projection of the finger which contacts the transparent conductive layer, which is more than an amount of light from a recession of the finger which does not contact the transparent conductive layer.

2. The reading apparatus according to claim 1, wherein the plurality of photosensors are formed as a two dimensional arrangement.

3. The reading apparatus according to claim 1, wherein said transparent conductive layer dissipates static electricity.

4. The reading apparatus according to claim 1, wherein said plurality of photosensors read an amount of a light reflected by the finger.

5. The reading apparatus according to claim 1, wherein said plurality of photosensors read an amount of a light passing through the finger.

6. A recognition device for reading a fingerprint of a finger comprising:
- a photosensor module having a plurality of photosensors arranged in at least one plane;
- a transparent conductive layer provided on one side of said photosensor module to face said plane;
- a driving circuit controlling the photosensor module; and
- a light source emitting a light incident on the finger,
- wherein said plurality of photosensors read an amount of light from a projection of the finger which contacts the transparent conductive layer, which is more than an amount of light from a recession of the finger which does not contact the transparent conductive layer.

7. A recognition device for reading a fingerprint of a finger comprising:
- a photosensor module having a plurality of photosensors arranged in at least one plane;
- a transparent conductive layer formed on one side of said photosensor module to face said plane;
- a system controlled by a judgment based on the photosensor module; and
- a light source emitting a light incident on the finger,
- wherein said plurality of photosensors read an amount of light from a projection of the finger which contacts the transparent conductive layer, which is more than an amount of light from a recession of the finger which does not contact the transparent conductive layer.

8. The recognition device according to claim 7, wherein the system includes a computer system.

9. The recognition device according to claim 7, wherein the system includes a door lock system.

10. A reading apparatus for reading a fingerprint comprising:
- a photosensor module having a plurality of photosensor for sensing a brightness of a light from a finger; and
- a transparent conductive layer formed on one side of said photosensor module, on which the finger is put,
- wherein said plurality of photosensors sense a brightness of light from a projection of the finger which contacts the transparent conductive layer which is more than a brightness of light from a recession of the finger which does not contact the transparent conductive layer
- wherein the light incident on the photosensor module is originated from an outer light surrounding the reading apparatus and the finger.

11. The reading apparatus according to claim 10, wherein said transparent conductive layer dissipates static electricity.

12. The reading apparatus according to claim 10, wherein said plurality of photosensors sense the brightness of the light reflected by the finger.

13. The reading apparatus according to claim 10, wherein said plurality of photosensors sense the brightness of the light passing through the finger.

14. A recognition device comprising:
- a photosensor module having a plurality of photosensors for sensing a brightness of light from a finger;
- a transparent conductive layer for contacting the finger, provided between the finger and the photosensor module; and
- a driving circuit controlling the photosensor module,
- wherein said plurality of photosensors sense a brightness of light from a projection of the finger which contacts the transparent conductive layer, which is more than a brightness of light from a recession of the finger which does not contact the transparent conductive layer,
- wherein the light incident on the photosensor module is originated from an outer light surrounding the light recognition device and the finger.

15. A recognition device comprising:
- a photosensor module having a plurality of photosensors for sensing a brightness of light from a finger;
- a transparent conductive layer for contacting the finger, provided between the finger and the photosensor module; and
- a system controlled by a judgment based on the photosensor module,
- wherein said plurality of photosensors sense a brightness of light from a projection of the finger which contacts the transparent conductive layer, which is more than a brightness of light from a recession of the finger which does not contact the transparent conductive layer,
- wherein the light incident on the photosensor module is originated front an outer light surrounding the recognition device and the finger.

16. The recognition device according to claim 15, wherein the system includes a computer system.

17. The recognition device according to claim 15, wherein the system includes a door lock system.

18. A reading apparatus comprising:
- a contact member having one face to be contacted with a finger; and
- a plurality of photosensors arranged on the other face of the contacting member, each of the plurality of photosensors sensing an amount of light from a projection of the finger which contacts the contact member, which is more than an amount of light from a recession of the finger which does not contact the contact member,
- wherein the light incident on the plurality of photosensors is originated from an outer light surrounding the reading apparatus and the finger.

19. The reading apparatus according to claim 18, wherein the contact member is transparent.

20. The reading apparatus according to claim 18, wherein said plurality of photosensors sense an amount of the light reflected by the finger.

21. The reading apparatus according to claim 18, wherein said plurality of photosensors sense an amount of the light passing through the finger.

22. A recognition device comprising:
- a contact member having one face to be contacted with a finger, for dissipating static electricity of the finger;
- a plurality of photosensors arranged on the other face of the contacting member, each of the plurality of photosensors sensing an amount of a light from a projection of the finger which contacts the contact member, which is more than an amount of a light from a recession of the finger which does not contact the contact member;
- a driving circuit controlling the plurality of photosensors; and
- a light source emitting a light incident on the finger.

23. A recognition device comprising:
- a contact member having one face to be contacted with a finger for dissipating static electricity of the finger;

a plurality of photosensors arranged on the other face of the contacting member, each of the plurality of photosensors sensing an amount of a light from a projection of the finger which contacts the contact member, which is more than an amount of a light from a recession of the finger which does not contact the contact member; and a system controlled by a judgment based on the plurality of photosensors, wherein the light incident on the plurality of photosensors is originated from an outer light surrounding the recognition device and the finger.

24. The recognition device according to claim 23, wherein the system includes a computer system.

25. The recognition device according to claim 23, wherein the system includes a door lock system.

* * * * *